United States Patent
Otowa et al.

(10) Patent No.: US 8,098,785 B2
(45) Date of Patent: Jan. 17, 2012

(54) SIGNAL PROCESSING CIRCUIT

(75) Inventors: Satoshi Otowa, Gifu-ken (JP); Hisashi Zaimoku, Saitama (JP); Masaaki Wada, Kumagaya (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 955 days.

(21) Appl. No.: 11/951,795

(22) Filed: Dec. 6, 2007

(65) Prior Publication Data
US 2008/0260083 A1   Oct. 23, 2008

(30) Foreign Application Priority Data
Dec. 7, 2006   (JP) ................................. 2006-330328

(51) Int. Cl.
*H04L 7/00* (2006.01)

(52) U.S. Cl. ........ 375/355; 375/147; 375/360; 375/362; 375/364; 375/371; 375/373; 375/376

(58) Field of Classification Search .................. 375/355, 375/346, 147, 360, 362, 364, 371, 373, 376, 375/350; 327/91, 156, 157, 158; 348/308, 348/468, 638, 572
See application file for complete search history.

(56) References Cited

U.S. PATENT DOCUMENTS
| 5,255,289 | A | 10/1993 | Tomita |
| 6,700,570 | B2 * | 3/2004 | Tachibana et al. ............ 345/213 |
| 7,397,876 | B2 * | 7/2008 | Cranford et al. ............. 375/355 |

FOREIGN PATENT DOCUMENTS
| JP | 5037850 | A | 2/1993 |
| JP | 5037907 | A | 2/1993 |
| JP | 10319917 | A | 12/1998 |
| JP | 2001356729 | A | 12/2001 |

OTHER PUBLICATIONS

Chinese Office Action for Application No. 200710196933.2, mailed on May 25, 2010 (7 pages).
Japanese Office Action for Application No. 2006-330328, mailed on Jul. 19, 2011 (4 pages).
esp@cenet Patent Abstract for Japanese Publication No. 5037850, publication date Feb. 12, 1993. (1 page).
esp@cenet Patent Abstract for Japanese Publication No. 10319917, publication date Dec. 4, 1998. (1 page).
esp@cenet Patent Abstract for Japanese Publication No. 5037907, publication date Feb. 12, 1993. (1 page).
esp@cenet Patent Abstract for Japanese Publication No. 2001-356729, publication date Dec. 26, 2001. (1 page).

* cited by examiner

*Primary Examiner* — Dhaval Patel
(74) *Attorney, Agent, or Firm* — Osha • Liang LLP (57) ABSTRACT

A signal processing circuit detects a pulsative change point of an input signal and sets a phase point which is shifted by a predetermined phase difference from the detected pulsative change point of the input signal as the timing for sampling the input signal.

4 Claims, 9 Drawing Sheets

RELATED ART

RELATED ART

Fig. 9

SIGNAL PROCESSING CIRCUIT

CROSS-REFERENCE TO RELATED APPLICATION

The entire disclosure of Japanese Patent Application No. 2006-330328 including the specification, claims, drawings, and abstract is incorporated herein by references.

BACKGROUND OF THE INVENTION

1. Field of the Invention

The present invention relates to a signal processing circuit which is operable to determine timing for sampling an input signal.

2. Description of the Related Art

A phase adjustment circuit can be used to appropriately set timing for sampling a signal which cyclically changes. For example, the phase adjustment circuit determines a sampling phase for sampling and outputting, at predetermined periods of time, RGB digital signals, such as television broadcasting signals which are encoded according to the National Television Standards Committee (NTSC) system or the Phase Alternating Line (PAL) system.

Figure 7:
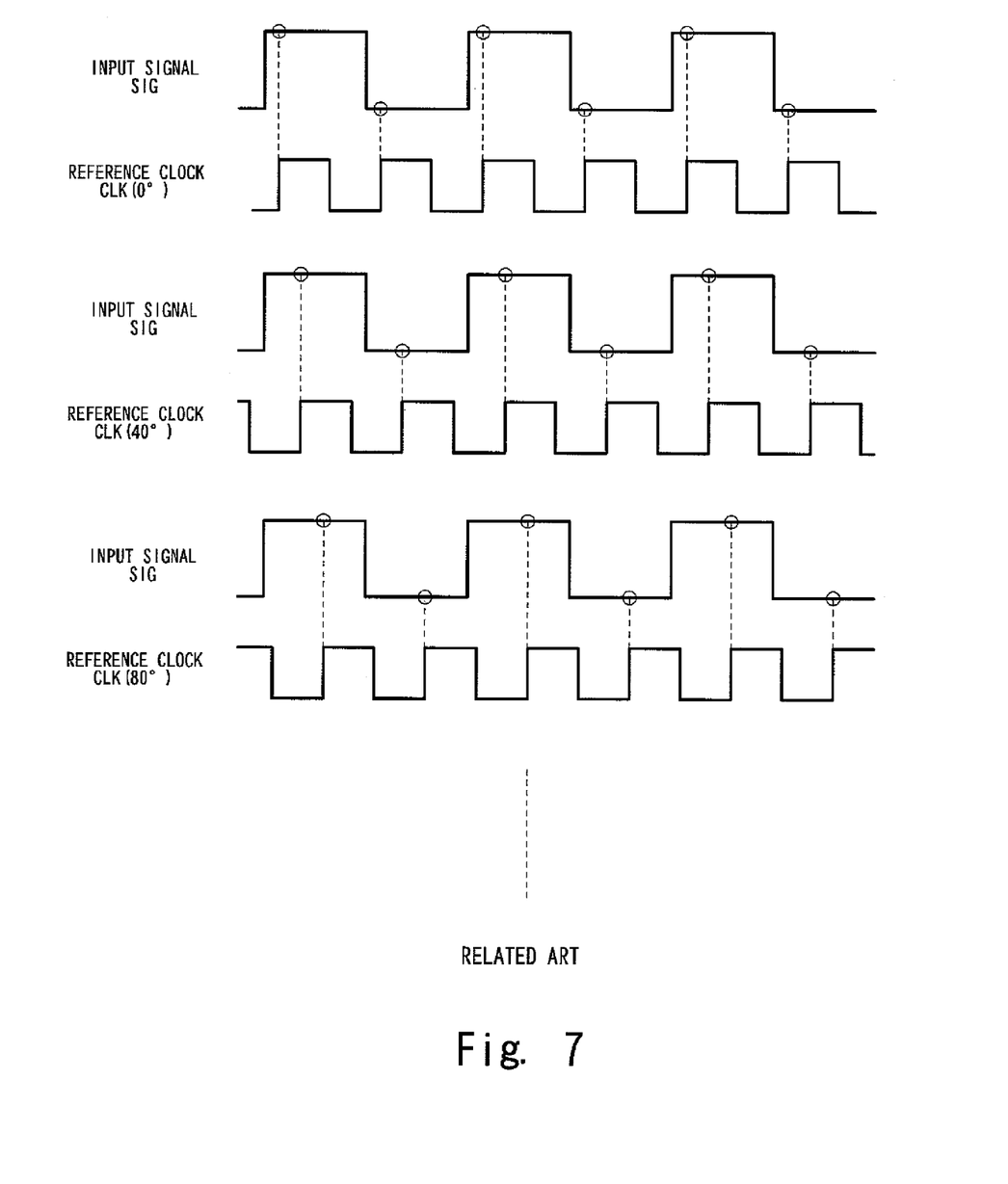
FIG. 7 is a timing chart illustrating a phase difference representing sampling timing according to a conventional phase adjustment circuit.

FIG. 7 illustrates a sampling phase setting method according to a conventional phase adjustment circuit. An input signal SIG is a pulse signal that cyclically changes. A reference clock CLK is a pulse signal whose cyclic period is equal to a half of the cyclic period of the input signal SIG. The phase adjustment circuit performs sampling of the input signal SIG at a rise time (indicated by a white circle in the drawing).

In this case, the phase adjustment circuit adjusts a phase difference between the input signal SIG and the reference clock CLK so that the sampling timing accords with a maximum value and a minimum value of the input signal SIG in each cycle. Hence, as illustrated in FIG. 7, the phase adjustment circuit changes a phase θ of the reference clock CLK relative to the input signal SIG in increments of a predetermined amount (e.g., 20°), and obtains a phase θm where a difference between consecutive sampling values can be maximized. The phase adjustment circuit sets the obtained phase θm as a sampling phase difference between the input signal SIG and the reference clock CLK.

Figure 8:
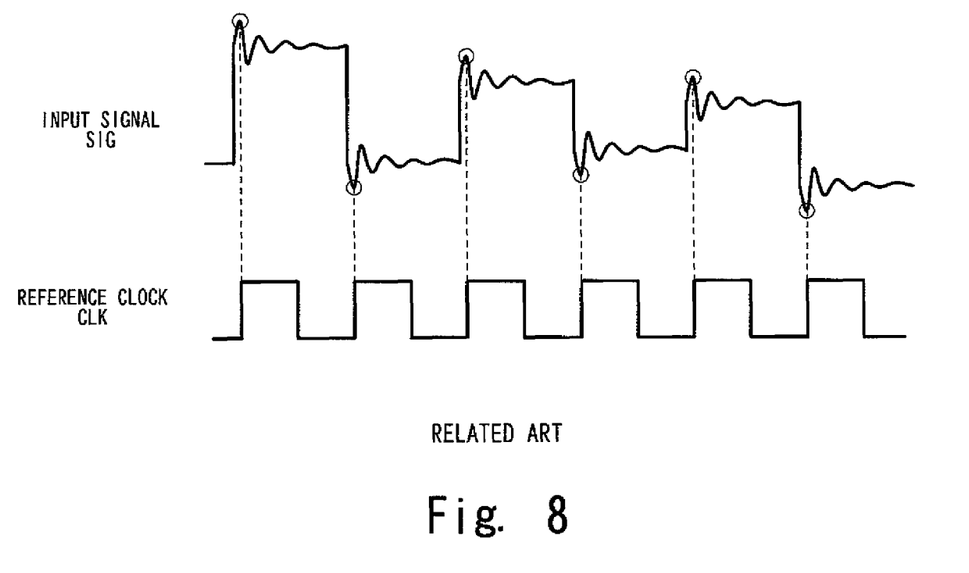
FIG. 8 is a timing chart illustrating a relationship between overshoot and undershoot of a signal and a sampling timing according to a conventional phase adjustment circuit.

However, as illustrated in FIG. 8, the input signal SIG (i.e., a pulse signal) tends to overshoot or undershoot in the vicinity of rising or falling portions. In other words, the input signal SIG may include a noise component in a rising or falling portion. If the phase adjustment circuit obtains the phase θm (i.e., the sampling phase where the difference between consecutively obtained sampling values can be maximized) while changing the phase θ of the reference clock CLK relative to the input signal SIG, the sampling timing is adjusted to accord with the overshoot timing and the undershoot timing of the input signal SIG.

Figure 9:
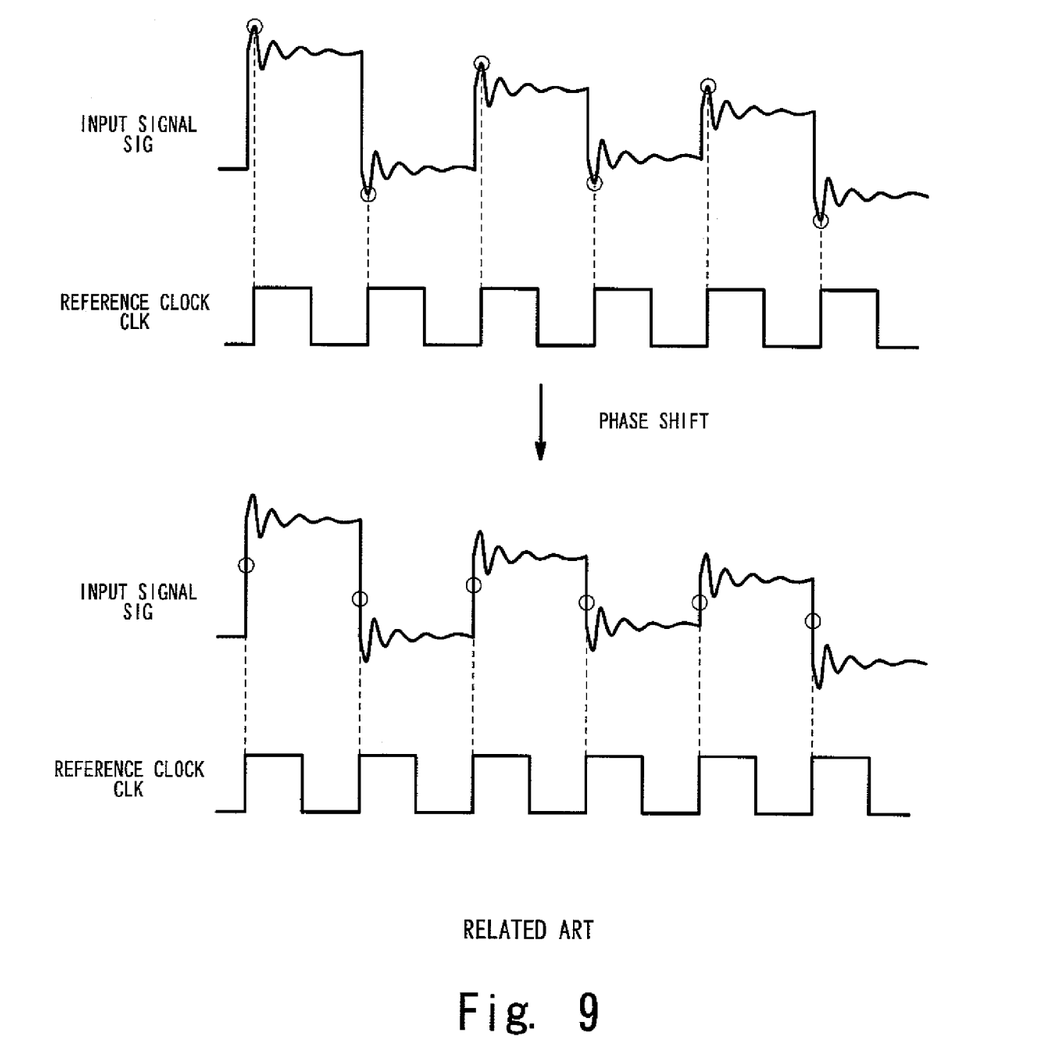
FIG. 9 is a timing chart illustrating adverse effects of overshoot and undershoot of a signal and a sampling timing according to a conventional phase adjustment circuit.

However, the overshoot timing is very close to the rising portion of the input signal SIG and the undershoot timing is very close to the falling portion of the input signal SIG. Therefore, if the phase difference between the input signal SIG and the reference clock CLK is slightly shifted, the sampling timing may match the rising portion and the falling portion of input signal SIG as illustrated in FIG. 9, and the sampling values may not accurately represent the amplitude of a pulse signal. For example, if the input signal SIG is a video signal, flicker effects of a regenerated video signal may occur if the sampling values fluctuate.

SUMMARY OF THE INVENTION

According to one aspect of the present invention, a signal processing circuit is operable to determine timing for sampling an input signal that causes a pulsative change. The signal processing circuit includes a change point detection unit configured to detect a pulsative change point of the input signal. A phase point which is shifted by a predetermined phase difference from the pulsative change point of the input signal detected by the change point detection unit is set as timing for sampling the input signal.

BRIEF DESCRIPTION OF THE DRAWINGS

Preferred embodiments of the present invention will be described in detail based on the following drawings, wherein.

DESCRIPTION OF PREFERRED EMBODIMENT

Apparatus Arrangement

Figure 1:
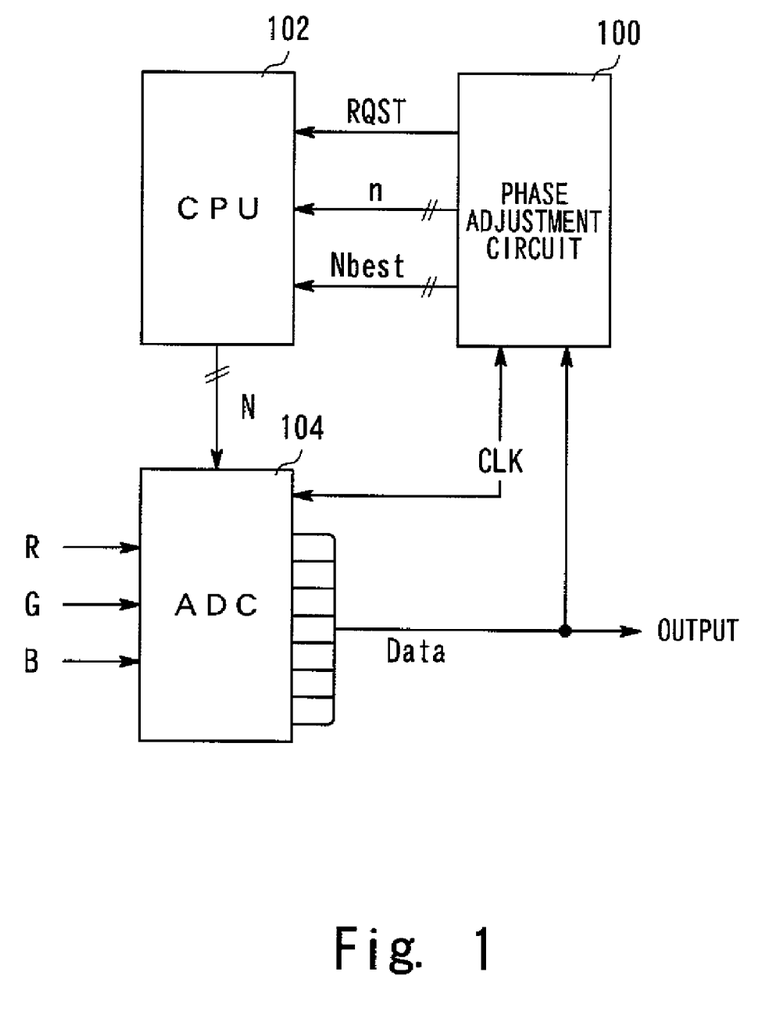
FIG. 1 is a circuit diagram illustrating a signal processing circuit according to an embodiment of the present invention.

As illustrated in FIG. 1, a signal processing circuit according to an embodiment of the present invention includes a phase adjustment circuit 100, a control unit (central processing unit (CPU)) 102, and an analog/digital circuit (ADC) 104. The example signal processing circuit according to this embodiment is a circuit configured to digitize a video signal and perform sampling of the digitized video signal. However, the present invention is not limited to the signal processing circuit illustrated in FIG. 1.

The phase adjustment circuit 100 receives an input signal Data and a reference clock CLK, and outputs a phase change request RQST, a phase number n, and an optimum phase number Nbest (i.e., signals for adjusting the phase of the input signal Data with the phase of the reference clock CLK) to the CPU 102. The phase change request RQST, the phase number n, and the optimum phase number Nbest can be used by the ADC 104 that performs sampling of the input signal Data and analog/digital conversion processing. An exemplary operation of the phase adjustment circuit 100 is described below.

The CPU 102 receives the phase change request RQST, the phase number n, and the optimum phase number Nbest from the phase adjustment circuit 100. The CPU 102 controls the analog/digital conversion processing performed in the ADC 104 based on the received signals.

More specifically, if the phase change request RQST is at a low level and the input phase number n is updated, the CPU 102 outputs the updated number as a phase number N to the ADC 104. On the other hand, if the phase change request RQST is in a high level, the CPU 102 outputs the phase number N representing a phase difference which is shifted by 180° from a phase difference corresponding to the input optimum phase number Nbest to the ADC 104.

The ADC 104 receives analog input signals from the outside together with the reference clock CLK. The ADC 104 converts the received analog signals into a digital signal and outputs the digitized signal Data. The reference clock CLK, as described above, is a pulse signal whose cyclic period is equal to a half of the cyclic period of the input signal. The ADC 104 receives the phase number N from the CPU 102 and samples the input signal in synchronism with a rise time of the reference clock CLK in a state wherein a phase difference determined according to the phase number N is present between the input signal and the reference clock CLK. The ADC 104 generates the digitized sampling signal.

More specifically, to check an optimum sampling point, the ADC 104 successively changes the phase difference between the input signal and the reference clock CLK in increments of a predetermined angle θ (i.e., phase number N×angle θ). The ADC 104 samples the input signal in synchronism with a rise time of the reference clock CLK and digitizes the sampling signal. The ADC 104 outputs the digitized signal Data to an external processing circuit and the phase adjustment circuit 100. According to an exemplary embodiment, the ADC 104 receives RGB signals (i.e., input signals obtained from a video signal) and outputs a digitized signal.

Figure 2:
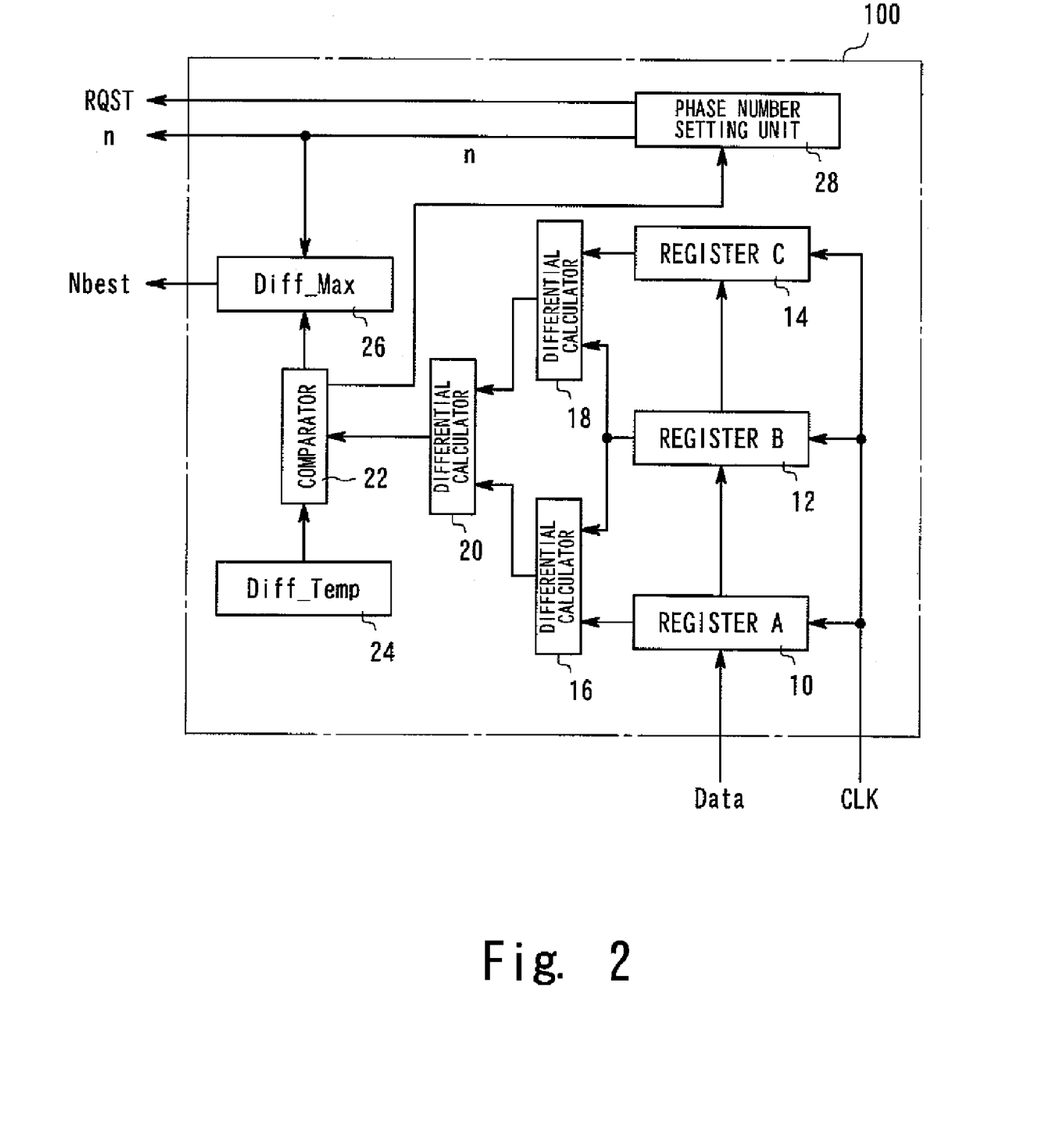
FIG. 2 is a circuit diagram illustrating a phase adjustment circuit according to an embodiment of the present invention.

As illustrated in FIG. 2, the phase adjustment circuit 100 according to the present example includes a register A 10; a register B 12; a register C 14; differential calculators 16, 18, and 20; a comparator 22; a reference value register 24; an optimum phase number register 26; and a phase number setting unit 28. The phase adjustment circuit 100 receives the digitized input signal Data from the ADC 104 and the reference clock CLK being externally provided. The phase adjustment circuit 100 obtains a suitable phase difference between the input signal and the reference clock CLK for sampling the input signals (RGB signals) based on these signals.

Three registers (i.e., register A 10, register B 12, and register C 14) can temporarily store the digital signal Data received from the ADC 104. The register A 10 directly receives the digital signal Data from the ADC 104, and stores the received digital signal Data into its built-in memory (i.e., updates a value of the built-in memory) in response to a rise time of the reference clock CLK.

The register B 12 receives the data held in the register A 10 and updates a value of its built-in memory with the received data in response to a rise time of the reference clock CLK. The register C 14 receives the data held in the register B 12 and updates a value of its built-in memory with the received data in response to a rise time of the reference clock CLK. In this manner, the digital signal Data received from the ADC 104 is successively shifted and held in the register A 10, the register B 12, and the register C 14.

The register A 10 outputs the data it holds (stored data) to the differential calculator 16. The register B 12 outputs the data it holds (stored data) to the differential calculators 16 and 18. The register C 14 outputs the data it holds (stored data) to the differential calculator 18.

The differential calculator 16 calculates a difference value (absolute value) between two data values received from the register A 10 and the register B 12 in synchronism with the timing the memory values of the register A 10 and the register B 12 are updated in response to the reference clock CLK. The differential calculator 16 outputs a calculated absolute difference to the differential calculator 20.

The differential calculator 18 calculates a difference value (absolute value) between two data received from the register B 12 and the register C 14 in synchronism with the timing the memory values of the register B 12 and the register C 14 are updated in response to the reference clock CLK. The differential calculator 18 outputs the calculated absolute difference to the differential calculator 20.

The differential calculator 20 receives the difference values from the differential calculators 16 and 18, and calculates a difference of two values received from the differential calculators 16 and 18 in synchronism with the timing the output values of the differential calculators 16 and 18 are updated. The differential calculator 20 outputs the calculated difference value to the comparator 22.

The comparator 22 receives the difference value from the differential calculator 20, and compares the received difference value with a maximum difference value Diff_Temp which is memorized in the reference value register 24 in synchronism with the timing the difference value of the differential calculator 20 is updated. If comparator 22 determines that the difference value obtained from the differential calculator 20 is greater than the maximum difference value Diff_Temp, the comparator 22 updates the maximum difference value Diff_Temp stored in the reference value register 24 with the difference value obtained from the differential calculator 20. Furthermore, the comparator 22 outputs a phase number update signal to the optimum phase number register 26. If the comparator 22 terminates the above-described comparison processing, the comparator 22 outputs a comparison termination signal (i.e., a signal indicating termination of the comparison processing) to the phase number setting unit 28.

If the optimum phase number register 26 receives a setting value update signal from the comparator 22, the optimum phase number register 26 updates a value of its built-in memory with the phase number n received from the phase number setting unit 28. The optimum phase number register 26 outputs the stored value of the built-in memory as the optimum phase number Nbest to the CPU 102.

If the phase number setting unit 28 receives the phase number update signal from the comparator 22, the phase number setting unit 28 updates the phase number n (i.e., a signal representing a phase difference between the input signal and the reference clock CLK) and outputs the updated phase number n to the optimum phase number register 26 and the CPU 102. The phase number setting unit 28 cyclically updates the phase number n from 0 to a maximum phase number Nmax (i.e., a predetermined setting value). The maximum phase number Nmax can be set to a minimum integer value satisfying the following relationship:

$$\text{Angle } \theta \times (N\text{max}+1) = \text{Integer multiple of } 180°$$

For example, if the angle θ is 20°, a minimum integer multiple of the angle θ that accords with an integer multiple of the angle 180° is 9 (i.e., 20°×9=180°). Therefore, the maximum phase number Nmax can be set to 8 (=9−1). If the angle θ is 50°, a minimum integer multiple of the angle θ that accords with an integer multiple of the angle 180° is 18 (i.e., 50°×18=180°×5=900°). Therefore, the maximum phase number Nmax can be set to 17 (=18−1).

Furthermore, if the updated phase number n accords with the maximum phase number Nmax, the phase number setting unit 28 stops updating the phase number n for a while. The phase number setting unit 28 changes the phase change request RQST from a low level to a high level. The CPU 102, if the phase change request RQST is changed to a high level, outputs to the ADC 104 the phase number N corresponding to a phase difference which is shifted by 180° from a phase difference corresponding to the maximum phase number Nmax received from the phase number setting unit 28. The ADC 104 performs sampling of input signals in a state wherein a phase difference between the input signal and the reference clock CLK is set to a phase difference corresponding to the phase number N.

If a predetermined time has elapsed, or if a sampling phase adjustment is requested by other external apparatus, the phase number setting unit 28 can change the phase change request RQST from a high level to a low level and can again start updating the phase number n from 0 to Nmax.

Phase Adjustment Processing

Figure 3:
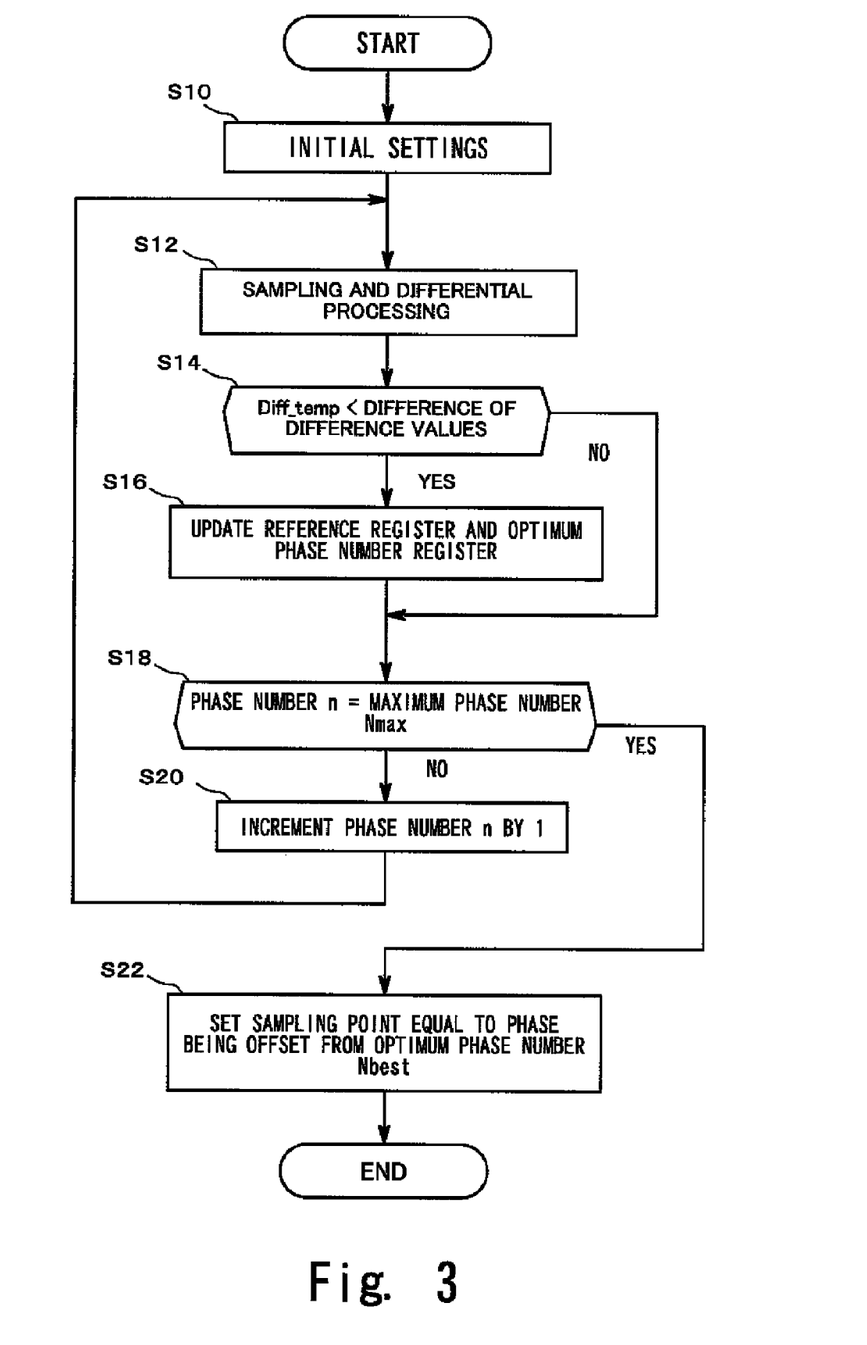
FIG. 3 is a flowchart illustrating phase adjustment processing according to an embodiment of the present invention.
Figure 4:
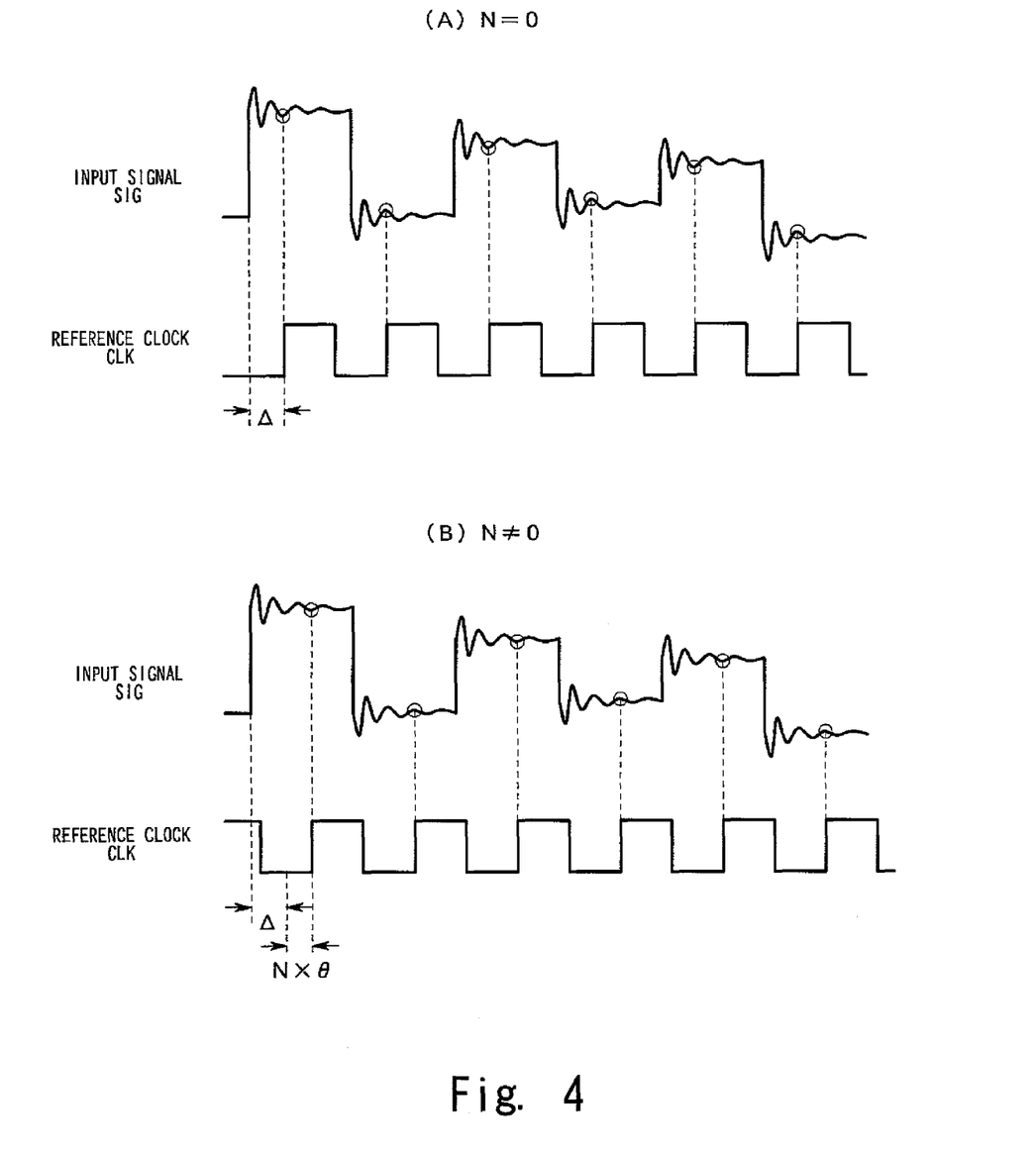
FIG. 4 is a timing chart illustrating sampling processing according to an embodiment of the present invention.

An example sampling phase adjustment processing performed by the signal processing circuit will next be described with reference to the flowchart of FIG. 3 and timing chart of FIG. 4.

At step S10, the signal processing circuit performs initial settings. More specifically, the phase number n, the reference value register 24, and the optimum phase number register 26 are reset to 0. The phase change request RQST is set to a low level.

At step S12, the signal processing circuit performs sampling of the input signal in a state wherein a phase difference between the input signal and the reference clock CLK is set to a value corresponding to the phase number N.

The phase number setting unit 28 outputs the phase number n being initially set to 0 and the phase change request RQST being initially set to a low level. The CPU 102 outputs the phase number N being initially set to 0 to the ADC 104. Accordingly, as illustrated in the timing chart (A) of FIG. 4, the ADC 104 performs sampling processing in synchronism with a rise time of the reference clock CLK in a state wherein the phase difference between the input signal and the reference clock CLK is set to an offset value Δ.

If the phase number N is not 0, the ADC 104 performs sampling of the input signal with a phase difference corresponding to the phase number N set between the input signal and the reference clock CLK. Namely, the ADC 104 increases the phase difference between the input signal and the reference clock CLK according to the phase number N supplied from the CPU 102. As illustrated in the timing chart (B) of FIG. 4, the ADC 104 performs sampling of the input signal in synchronism with a rise time of the reference clock CLK in a state wherein the phase difference between the input signal and the reference clock CLK is set to a value equal to the offset value Δ+phase number N×angle θ.

The phase adjustment circuit 100 receives a sampling value from the ADC 104. The sampling value is successively shifted and held in the register A 10, the register B 12, and register C 14. The differential calculators 16 and 18 calculate difference values (absolute values) between neighboring sampling values based on the values stored in these registers. Furthermore, the differential calculator 20 calculates a difference value (absolute value) between output values of the differential calculators 16 and 18.

At step S14, the comparator 22 determines whether an output value of the differential calculator 20 is greater than the value held in the reference value register 24. If the output value of the differential calculator 20 is greater than the value held in the reference value register 24, the processing flow proceeds to step S16. If the output value of the differential calculator 20 is equal to or less than the value held in the reference value register 24, the processing flow skips step S16 and proceeds to step S18.

At step S16, the reference value register 24 and the optimum phase number register 26 perform update processing. The comparator 22 outputs the output value of the differential calculator 20 to the reference value register 24 if the output value of the differential calculator 20 is greater than the value held in the reference value register 24. The reference value register 24 updates its memory value (Diff_Temp) with the output value of the differential calculator 20. Furthermore, the comparator 22 outputs the phase number update signal to the optimum phase number register 26. The optimum phase number register 26 updates its memory value (Diff_Max) with the phase number n being currently supplied from the phase number setting unit 28.

At step S18, the phase number setting unit 28 determines whether or not the phase number n is equal to the maximum phase number Nmax. If the phase number n is not equal to the maximum phase number Nmax, the processing flow proceeds to step S20. If the phase number n is equal to the maximum phase number Nmax, the processing flow proceeds to step S22.

At step S20, the phase number setting unit 28 increments the phase number n by 1. The processing flow returns to step S12. In step S12, in response to the updated phase number n, the ADC 104 performs sampling of input signals in synchronism with a rise time of the reference clock CLK at the phase difference corresponding to the phase number N supplied from the CPU 102.

Figure 5:
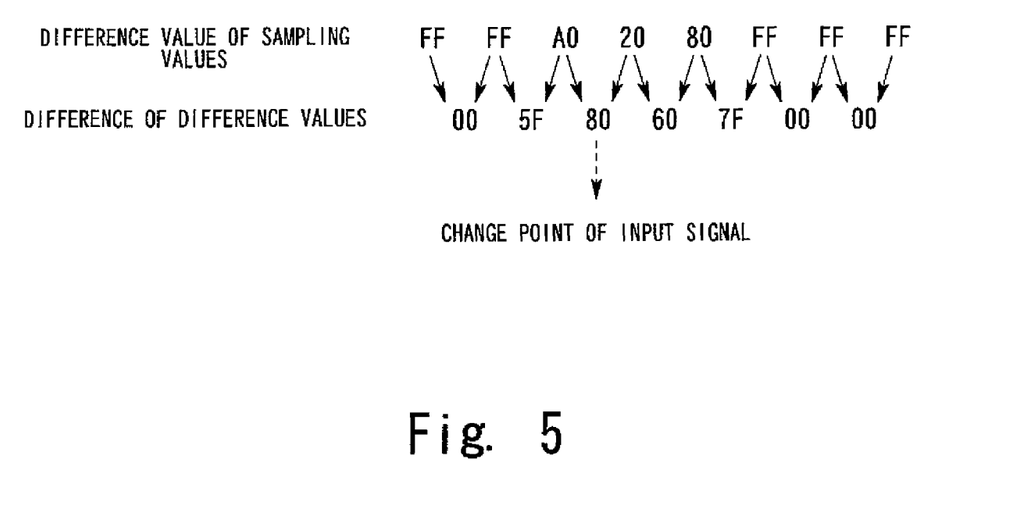
FIG. 5 illustrates processing for determining an optimum phase according to an embodiment of the present invention.

As described above, while incrementing the phase number n, the phase adjustment circuit 100 successively obtains difference values. More specifically, the primary-stage differential calculators (16, 18) obtain a difference value between neighboring sampling values. The secondary-stage differential calculator (20) obtains a difference between the difference values obtained by the primary-state differential calculators (16, 18). The comparator 22 compares the two-stage processed difference value (i.e., output of the secondary-state differential calculator (20)) with the memory value in the reference value register 24, as illustrated in FIG. 5.

The phase adjustment circuit 100 identifies a phase number n at which the difference value obtained through the above-described two-stage differential calculations can be maximized. The phase adjustment circuit 100 can set the identified phase number n to the optimum phase number register 26. Thus, the value which is stored in the optimum phase number register 26 indicates a phase where the rise time of the reference clock CLK accords with the rising (falling) portion where the input signal of the ADC 104 greatly changes as illustrated in FIG. 5.

Figure 6:
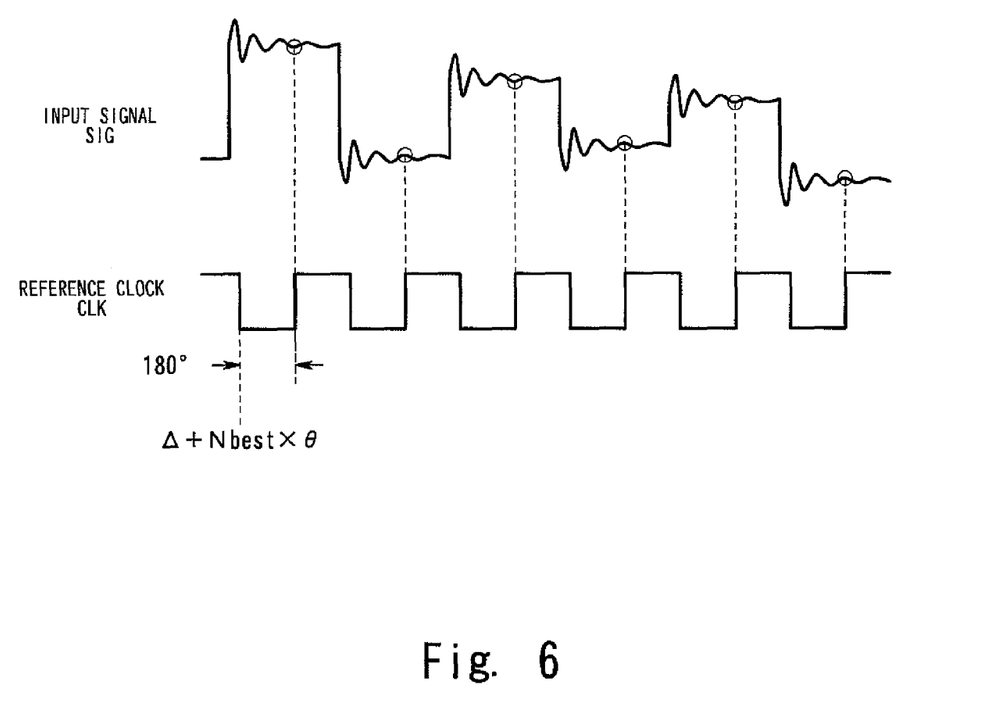
FIG. 6 is a timing chart illustrating a phase difference representing sampling timing according to an embodiment of the present invention.

At step S22, the phase number setting unit 28 changes the phase change request RQST from a low level to a high level. In response to the phase change request RQST that has changed to a high level, the CPU 102 outputs the phase number N to the ADC 104. As illustrated in FIG. 6, the phase number N represents a phase difference which is shifted by 180° from the phase difference between the input signal Data and the reference clock CLK indicated by the optimum phase number Nbest received from the phase adjustment circuit 100.

Thus, the ADC 104 can perform sampling of the input signal at a timing which is sufficiently shifted from a pulsative change point (rising portion or falling portion) of the input signal.

In the example used to illustrate the present embodiment, the angle to be shifted from the phase difference represented by the optimum phase number Nbest is equal to 180°, but the present invention is not limited to this configuration. A preferable setting range of the above-described angle to be shifted is not less than 50° and not greater than 310°. For example, when an input signal is a video signal of the television broadcasting, the setting angle in the above-described preferable range (i.e., not less than 50° and not greater than 310°) can eliminate adverse effects of the overshoot appearing near the rising portion and the undershoot appearing near the falling portion. Accurate sampling processing can be performed if the angle to be shifted is close to 180°.

What is claimed is:

1. A signal processing circuit operable to determine timing for sampling an input signal that causes a pulsative change, comprising:
   a change point detection circuit configured to detect a pulsative change point of the input signal,
   wherein a phase point which is shifted by a predetermined phase difference from the pulsative change point of the input signal detected by the change point detection circuit is set as timing for sampling the input signal,
   wherein the change point detection circuit comprises:
   a first differential calculator configured to obtain a difference value between a plurality of sampling values of the input signal at first sampling times,
   a second differential calculator configured to obtain a difference value between a plurality of sampling values of the input signal at second sampling times different from the first sampling times of the sampling values processed by the first differential calculator, and
   third differential calculator configured to obtain a difference value between the difference values obtained by the first and second differential calculators, and
   wherein the change point detection circuit detects the pulsative change point of the input signal based on the difference value obtained by the third differential calculator.

2. The signal processing circuit according to claim 1, wherein the change point detection circuit detects a sampling timing at which the difference value obtained by the third differential calculator is maximized as the pulsative change point of the input signal.

3. The signal processing circuit according to claim 1, wherein the predetermined phase difference is not less than 50° and not greater than 310°.

4. The signal processing circuit according to claim 2, wherein the predetermined phase difference is not less than 50° and not greater than 310°.

* * * * *